United States Patent
Wu et al.

(10) Patent No.: US 8,570,114 B2
(45) Date of Patent: Oct. 29, 2013

(54) DEFECTED GROUND STRUCTURE WITH SHIELDING EFFECT

(75) Inventors: Tzong-Lin Wu, Taipei (TW); Yu-Hao Hsu, Taipei (TW); Chung-Hao Tsai, Taipei (TW)

(73) Assignee: National Taiwan University, Taipei (TW)

( * ) Notice: Subject to any disclaimer, the term of this patent is extended or adjusted under 35 U.S.C. 154(b) by 422 days.

(21) Appl. No.: 12/902,155

(22) Filed: Oct. 12, 2010

(65) Prior Publication Data

US 2012/0057323 A1    Mar. 8, 2012

(30) Foreign Application Priority Data

Sep. 8, 2010   (TW) .............................. 99130391 A

(51) Int. Cl.
*H01Q 15/02*   (2006.01)

(52) U.S. Cl.
USPC ........................................... 333/12; 343/909

(58) Field of Classification Search
USPC .......... 343/700 MS, 753, 754, 756, 767, 783, 343/795, 909, 913; 333/12, 24 R, 204
See application file for complete search history.

(56) References Cited

U.S. PATENT DOCUMENTS

| | | | |
|---|---|---|---|
| 6,426,722 B1 * | 7/2002 | Sievenpiper et al. | .. 343/700 MS |
| 6,552,696 B1 * | 4/2003 | Sievenpiper et al. | ......... 343/909 |
| 6,933,895 B2 * | 8/2005 | Mendolia et al. | ............. 343/702 |

OTHER PUBLICATIONS

C.K. Wu, H.S. Wu, C.K.C. Tzuang, "Electric-Magnetic-Electric Slow-Wave Microstrip Line and Bandpass Filter of Compressed Size", IEEE Trans. on Microwave Theory and Techniques, vol. 50, No. 8, Aug. 2002, pp. 1996-2004.*

* cited by examiner

*Primary Examiner* — Stephen Jones
(74) *Attorney, Agent, or Firm* — Jianq Chyun IP Office

(57) ABSTRACT

A defected ground structure with shielding effect is provided. The structure includes a dielectric layer, a defected metal layer, a grounded metal layer and at least a conductive mushroom-like structure. The defected metal layer has a line-shaped opening and is disposed in the dielectric layer. The conductive mushroom-like structure is disposed between the defected metal layer and the grounded metal layer and is arranged along an extending direction of the line-shaped opening periodically. The conductive mushroom-like structure includes a laterally extending member and a vertically extending member. The laterally extending member is parallel to the defected metal layer and a distance is maintained away from the defected metal layer. The projection area of the laterally extending member on the defected metal layer covers a length of the line-shaped opening corresponding to the laterally extending member. The vertically extending member connects the laterally extending member and the grounded metal layer.

12 Claims, 6 Drawing Sheets

DEFECTED GROUND STRUCTURE WITH SHIELDING EFFECT

CROSS-REFERENCE TO RELATED APPLICATION

This application claims the priority benefit of Taiwan application serial no. 99130391, filed on Sep. 8, 2010. The entirety of the above-mentioned patent application is hereby incorporated by reference herein and made a part of specification.

BACKGROUND

1. Field of the Invention

The invention relates to a defected ground structure. Particularly, the invention relates to a defected ground structure with a shielding effect.

2. Description of Related Art

With development of wireless radio frequency (RF) and microwave communication systems, 3G and 3.5 G communication systems are widely used in the industry, and a 4 G communication system is under development. A wireless communication system generally includes a transmitting module and a receiving module comprising a power amplifier, a mixer, a voltage control oscillator and a bandpass filter, etc. The filter is located at a next stage of an antenna. Signal received by the antenna is transmitted to the filter, and the filter keeps the signals of required band and isolates the signals of unnecessary bands. Therefore, a frequency response quality of the filter directly influences correctness of signal processing of post-end circuits, and a performance of the filter determines the quality of the wireless communication system.

Since a planar micro strip filter has advantages of small size, easy fabrication and low cost, it is widely used in current wireless communication systems. In a stepped impedance resonator (SIR) structure provided by Makimoto in 1980, a microstrip resonator is designed in different widths to have different characteristic impedances, so that by adjusting a ratio of the widths (the characteristic impedances) of two sections of the resonator, an excellent characteristic of controlling double and triple base-frequency harmonic positions can be achieved.

A defected ground structure (DGS) is disclosed by South Korean scholars Park et al. in the late 1990s. The so-called "defected" refers to specific pattern units etched on a metal ground surface of a printed circuit board, which are generally a set of symmetric units or a plurality of periodically arranged units. The DGS disturbs a current distribution and changes an equivalent distributed inductance and capacitance of the original circuit. When an electromagnetic wave propagates on the DGS with periodic obstacles, energy (or frequency) thereof only appears at some specific wave vectors, so that the energy is suppressed at some frequency bands to achieve a special bandstop effect. Such characteristic of the DGS is widely used for designing microwave devices such as low-pass filters, and bandpass filters, etc.

Since in the wireless communication system, passive devices may occupy 65% of a total area of a RF front-end circuit, and the passive devices such as the filter, etc. are not easy to be integrated into a silicon substrate, it is still a development and research focus for designing a filter with small size, low cost, high selectivity and high performance.

SUMMARY OF THE INVENTION

The invention is directed to a resonator of a defected ground structure, which can reduce a size of a filter.

The invention provides a defected ground structure with a shielding effect. The defected ground structure includes a dielectric layer, a defected metal layer, a grounded metal layer and at least one conductive mushroom-like structure. The dielectric layer has a first surface and a second surface opposite to the first surface. The defected metal layer is disposed in the dielectric layer and located between the first surface and the second surface, and has a line-shaped opening. The grounded metal layer is disposed on the second surface. Moreover, the at least one conductive mushroom-like structure is disposed between the defected metal layer and the grounded metal layer, and is arranged along an extending direction of the line-shaped opening periodically. The conductive mushroom-like structure includes a laterally extending member and a vertically extending member. The laterally extending member is parallel to the defected metal layer and a distance is maintained between the laterally extending member and the defected metal layer. A projection area of the laterally extending member on the defected metal layer covers a portion of the line-shaped opening corresponding to the projection area of the laterally extending member. The vertically extending member connects the laterally extending member and the grounded metal layer.

In an embodiment of the invention, the defected metal layer has another line-shaped opening, and the projection area of the laterally extending member on the defected metal layer covers a portion of the other line-shaped opening corresponding to the projection area of the laterally extending member.

In an embodiment of the invention, the laterally extending member is a metal layer.

In an embodiment of the invention, a shape of the metal layer includes a rectangle, an ellipse or an irregular geometric figure.

In an embodiment of the invention, the vertically extending member includes a conductive through via.

In an embodiment of the invention, the vertically extending member includes a plurality of turning sections.

In an embodiment of the invention, the defected metal layer further has a first rectangular opening and a second rectangular opening. The first rectangular opening and the second rectangular opening are respectively connected to two ends of the line-shaped opening, and a length of a contact side of the first rectangular opening or the second rectangular opening and the line-shaped opening is greater than a width of the line-shaped opening.

In an embodiment of the invention, the conductive mushroom-like structure is arranged along the extending direction of the line-shaped opening periodically, and a predetermined space is maintained between two adjacent conductive mushroom-like structures.

In an embodiment of the invention, the defected ground structure with the shielding effect further includes a microstrip line disposed on the first surface.

In an embodiment of the invention, the distance between the laterally extending member and the defected metal layer is smaller than a distance between the laterally extending member and the grounded metal layer.

According to the above descriptions, the conductive mushroom-like structures disposed between the defected metal layer and the grounded metal layer are used to reduce a transmission line characteristic impedance and generate a slow wave effect, so as to reduce a size of a filter.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
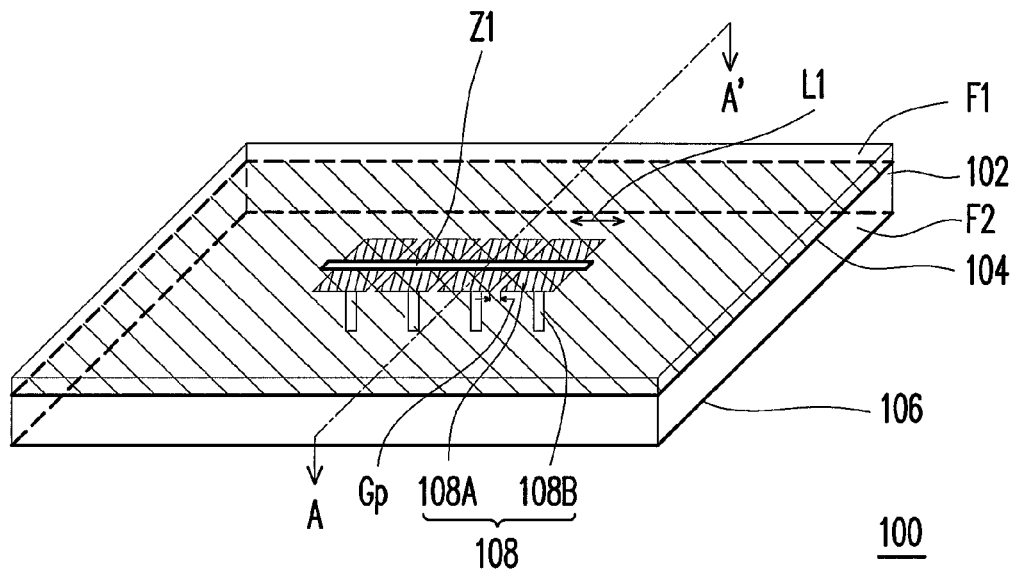
FIG. 1A is a side view of a resonator having a defected ground structure according to an embodiment of the invention.
Figure 1B:
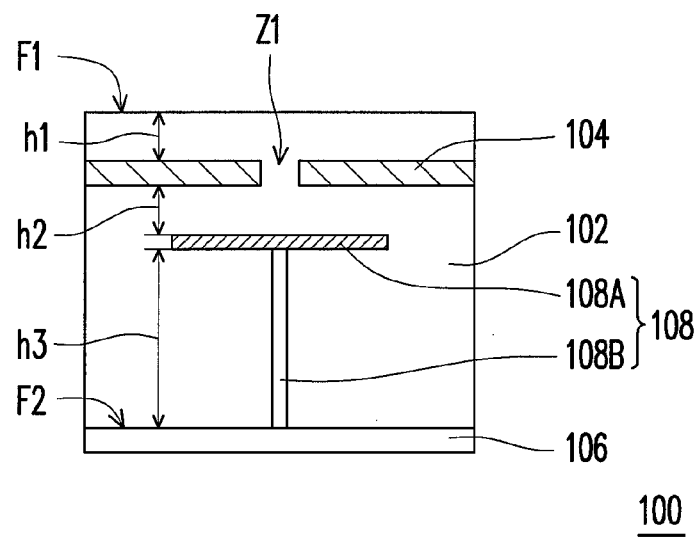
FIG. 1B is a cross-sectional view of FIG. 1A along an A-A' line.

FIG. 1A is a side view of a defected ground structure with a shielding effect according to an embodiment of the invention. FIG. 1B is a cross-sectional view of FIG. 1A along an A-A' line. Referring to FIG. 1A and FIG. 1B, the defected ground structure 100 includes a dielectric layer 102, a defected metal layer 104, a grounded metal layer 106 and at least one conductive mushroom-like structure 108. The dielectric layer 102 has a first surface F1 and a second surface F2 opposite to the first surface F1. The defected metal layer 104 is disposed in the dielectric layer 102, and is located between the first surface F1 and the second surface F2. A distance h1 is maintained between the defected metal layer 104 and the first surface F1, and the defected metal layer 104 has a line-shaped opening Z1, wherein the line-shaped opening Z1 can be formed by a chemical solvent etching process or an engraving process. In an exemplary embodiment, the distance h1 is 0.3 mm. The grounded metal layer 106 is disposed on the second surface F2. The dielectric layer 102 is, for example, epoxy resin or epoxy resin containing glass fiber, and a material of the defected metal layer 104, the grounded metal layer 106 and the conductive mushroom-like structure 108 is, for example, copper, though the invention is not limited thereto.

Moreover, the conductive mushroom-like structures 108 are disposed between the defected metal layer 104 and the grounded metal layer 106, and are periodically arranged along an extending direction of the line-shaped opening Z1. For example, the line-shaped opening Z1 is a strip rectangular opening, and three conductive mushroom-like structures 108 are arranged along the extending direction of the line-shaped opening Z1, wherein a predetermined space Gp is maintained between two adjacent conductive mushroom-like structures 108. In an exemplary embodiment, the predetermined space Gp is 0.2 mm. It should be noticed that the number of the conductive mushroom-like structures 108 is not limited to be three, and the number of the conductive mushroom-like structures 108 can be determined according to an actual design requirement.

Further, the conductive mushroom-like structure 108 includes a laterally extending member 108A and a vertically extending member 108B, wherein the laterally extending member 108A is a metal layer and is parallel to the defected metal layer 104, and a distance h2 is maintained between the laterally extending member 108A and the defected metal layer 104, while a distance h3 is maintained between the laterally extending member 108A and the grounded metal layer 106, wherein the distance h2 is smaller than the distance h3, i.e. the distance between the laterally extending member 108A and the defected metal layer 104 is smaller than the distance between laterally extending member 108A and the grounded metal layer 106. In an exemplary embodiment, the distance h2 and the distance h3 can be respectively 0.3 mm and 0.9 mm. Each of the laterally extending members 108A may shield a portion of the line-shaped opening Z1, for example, a projection area of each of the laterally extending members 108A on the defected metal layer 104 can cover the line-shaped opening Z1 by a length L1.

Figure 1C:
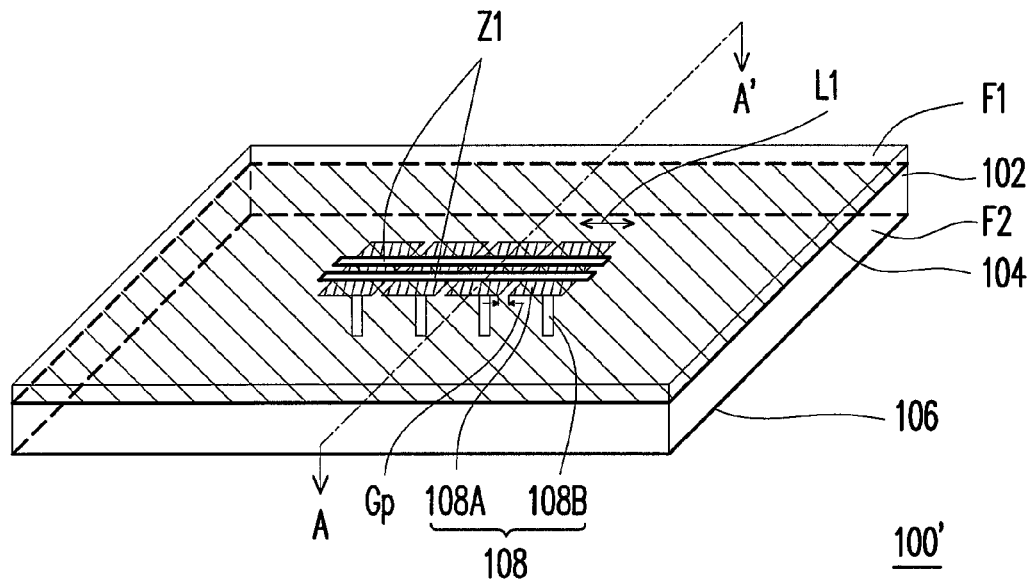
FIG. 1C is a side view of a filter having a defected ground structure according to another embodiment of the invention.
Figure 1D:
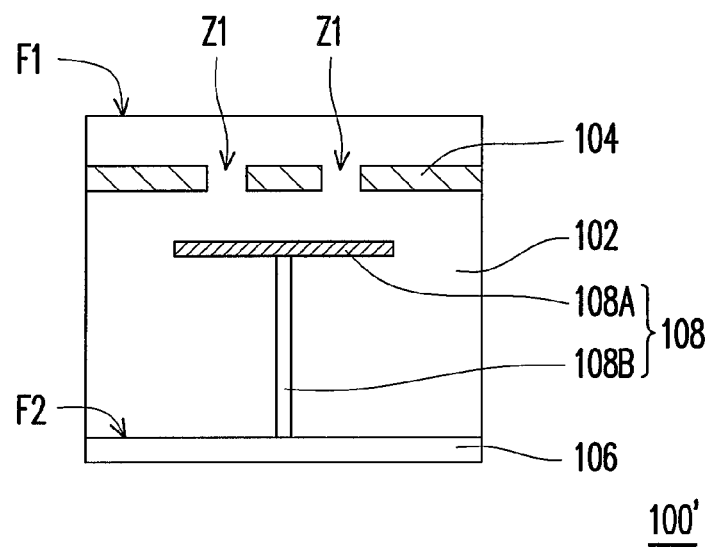
FIG. 1D is a cross-sectional view of FIG. 1C along an A-A' line.

It should be noticed that in other embodiments, along with different numbers or shapes of the openings on the defected metal layer 104, the projection area of the laterally extending member 108A on the defected metal layer 104 may cover multiple line-shaped openings Z1. For example, FIG. 1C is a side view of a defected ground structure with a shielding effect according to another embodiment of the invention. FIG. 1D is a cross-sectional view of FIG. 1C along an A-A' line. Referring to FIG. 1C and FIG. 1D, the defected metal layer 104 of the defected ground structure 100' has two parallel line-shaped openings Z1, so that the projection area of the laterally extending member 108A on the defected metal layer 104 may simultaneously cover two line-shaped openings Z1, i.e. the projection area of the laterally extending member 108A on the defected metal layer 104 contains two line-shaped openings Z1 with the length L1.

Figure 1E:
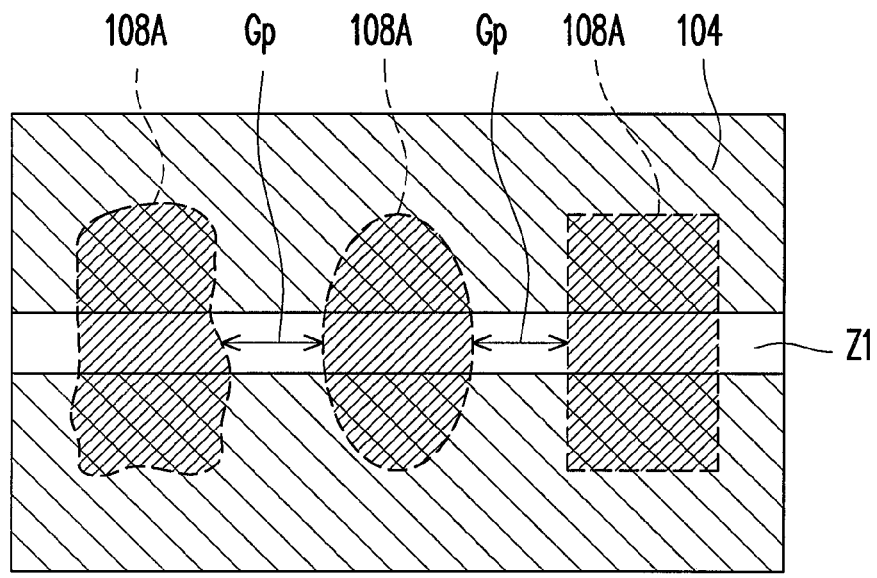
FIG. 1E is a top view of a filter having a defected ground structure according to another embodiment of the invention.

Moreover, in the embodiment of FIG. 1A, although the shapes of the laterally extending members 108A are rectangles, the invention is not limited thereto, and the laterally extending members 108A can also be the metal layers of different shapes, for example, ellipses or irregular geometric figures. In some embodiments, the metal layers of different shapes can be simultaneously used as the laterally extending members 108A, for example, FIG. 1E is a top view of a defected ground structure with a shielding effect according to another embodiment of the invention. The defected ground structure includes the laterally extending members 108A having shapes of a rectangle, an ellipse and an irregular shape, which are arranged along an extending direction of the line-shaped opening Z1, and the predetermined distance Gp is maintained between two adjacent laterally extending members 108A.

Figure 1F:
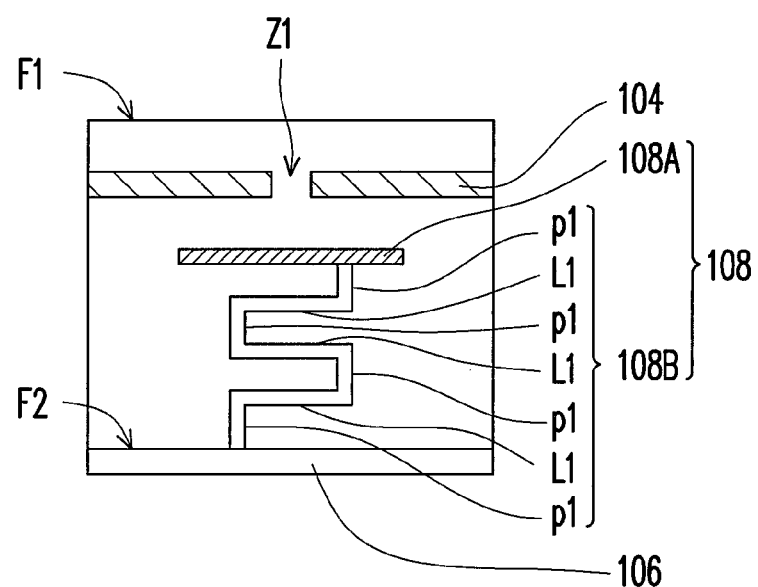
FIG. 1F is a cross-sectional view of filter having a defected ground structure according to another embodiment of the invention.

Moreover, the vertically extending member 108B is located between the laterally extending member 108A and the grounded metal layer 106, and is connected to the laterally extending member 108A and the grounded metal layer 106. In the present embodiment, the vertically extending member 108B is a conductive through via, though the invention is not limited thereto, and in other embodiments, the vertically extending member 108B can also be formed by a plurality of conductive through vias and a plurality of metal layers. For example, FIG. 1F is a cross-sectional view of a defected ground structure with a shielding effect according to another embodiment of the invention. The vertically extending member 108B is a structure formed by a plurality of turning sections, which includes four conductive through vias P1 and three metal layers L1. Moreover, the vertically extending member 108B is not limited to be located in the center of the laterally extending member 108A, which can also be located at a position deviated from the center of the laterally extending member 108A.

It should be noticed that in the conductive mushroom-like structures 108 of the above embodiments, the vertically extending members 108B are all located below the laterally extending members 108A, i.e. the conductive through vias forming the vertically extending members 108B do not penetrate through the laterally extending members 108A, though the connection method of the vertically extending member 108B and the laterally extending member 108A is not limited thereto. In other embodiments, when the vertically extending member 108B is connected to the laterally extending member 108A, the vertically extending member 108B can also penetrate through the laterally extending member 108A, i.e. the conductive through via forming the vertically extending member 108B can penetrate through the metal layer forming the laterally extending member 108A.

In the defected ground structure 100, interferences between the defected ground structure 100 and other lower-layer circuits can be isolated by the grounded metal layer 106 having a complete metal plane below the conductive mushroom-like structures 108, and meanwhile a radiation effect caused by the line-shaped openings Z1 on the defected metal layer 104 can also be suppressed. The conductive mushroom-like structure 108 can reduce a transmission line characteristic impedance, and generate an extra capacitance load to form a slow wave effect, so as to reduce a size of a filter. The so-called "slow wave effect" refers to that a phase velocity of an electromagnetic wave can be reduced by increasing an inductance and a capacitance of a transmission line, and under a same resonance frequency, a resonance wavelength is reduced by reducing the phase velocity, which represents that the size of the filter can be greatly reduced.

It should be noticed that the conductive mushroom-like structure 108 in the defected ground structure 100 can be used in filters of different structures. Embodiments are provided below to describe different filters using the conductive mushroom-like structure 108.

Figure 2A:
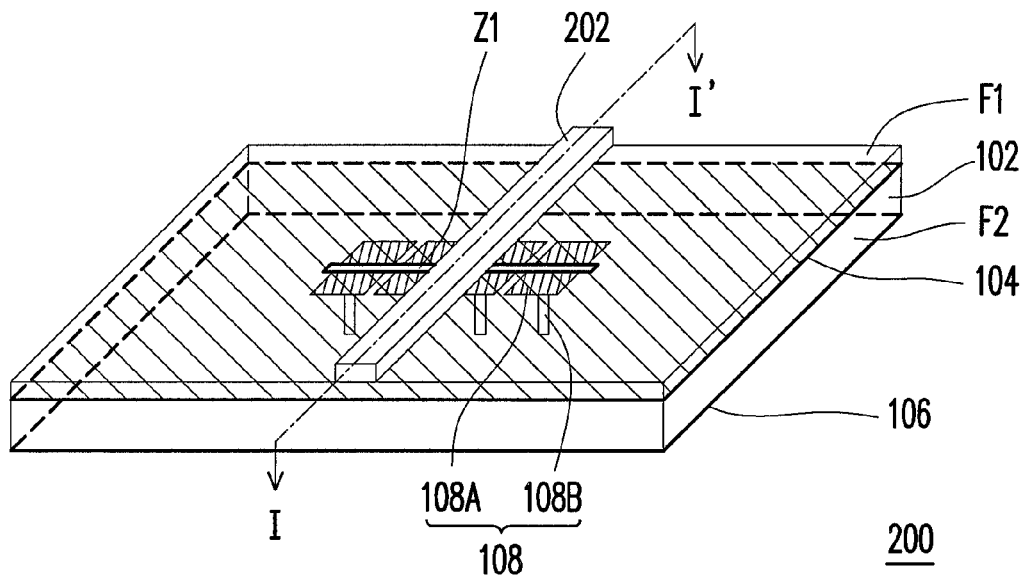
FIG. 2A is a side view of a bandstop filter according to an embodiment of the invention.
Figure 2B:
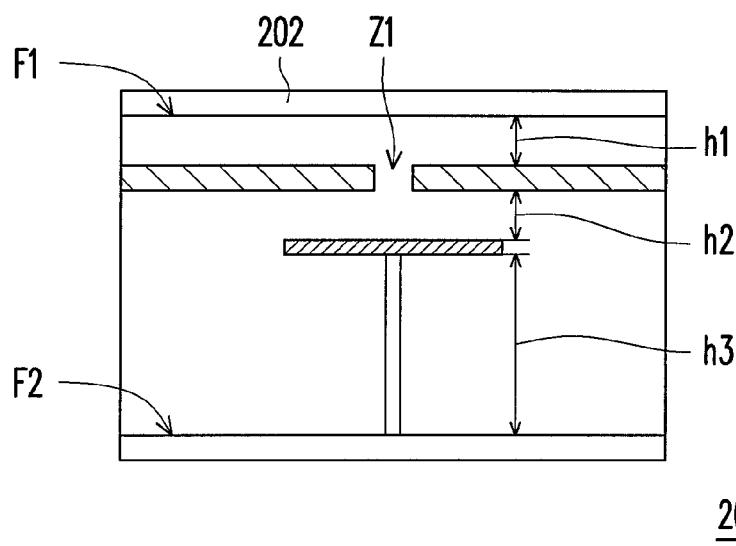
FIG. 2B is a cross-sectional view of FIG. 2A along an I-I' line.

FIG. 2A is a side view of a bandstop filter according to an embodiment of the invention. FIG. 2B is a cross-sectional view of FIG. 2A along an I-I' line. Referring to FIG. 2A and FIG. 2B, a difference between the bandstop filter 200 of the present embodiment and the defected ground structure 100 is that the bandstop filter 200 further includes a microstrip line 202, which is disposed on the first surface F1, and crosses over the line-shaped opening Z1, and is perpendicular to the extending direction of the line-shaped opening Z1. Similarly, the conductive mushroom-like structures 108 are also disposed between the defected metal layer 104 and the grounded metal layer 106, and are periodically arranged along the extending direction of the line-shaped opening Z1 as that shown in FIG. 1A. In this way, the conductive mushroom-like structures 108 can be used to reduce the slot-transmission-line characteristic impedance and form the slow wave effect, so as to reduce a size of the bandstop filter 200.

Figure 2C:
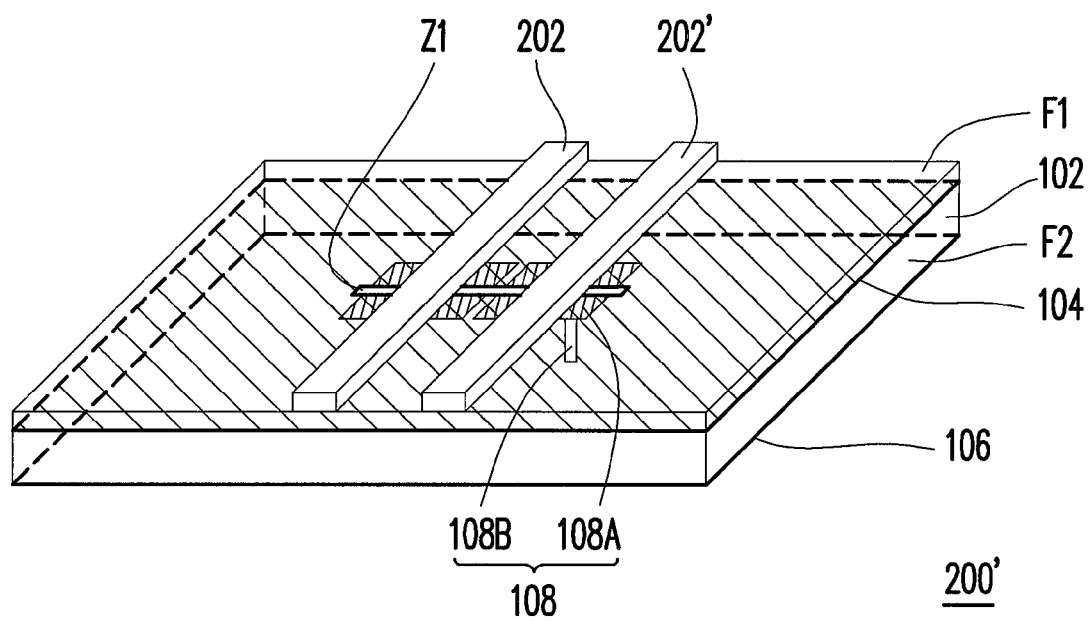
FIG. 2C is a side view of a bandstop filter according to another embodiment of the invention.

It should be noticed that a number of the microstrip lines 202 disposed on the first surface F1 is not limited to the number shown in FIG. 2A, which can be adjusted according to an actual design requirement. For example, FIG. 2C is a side view of a bandstop filter according to another embodiment of the invention. A difference between the bandstop filter 200' of FIG. 2C and the bandstop filter 200 is that the bandstop filter 200' further includes a microstrip line 202' parallel to the microstrip line 202 on the first surface F1, wherein the microstrip line 202' and the microstrip line 202 form coupled microstrip lines. When the two unshielded microstrip lines 202 and 202' are closed to each other, energy coupling is occurred due to a mutual function of electromagnetic fields. Lengths and widths of the microstrip lines 202 and 202' can be determined according to an actual design requirement, so as to design a frequency and an impedance characteristics corresponding to the bandstop filter 200'.

Figure 3:
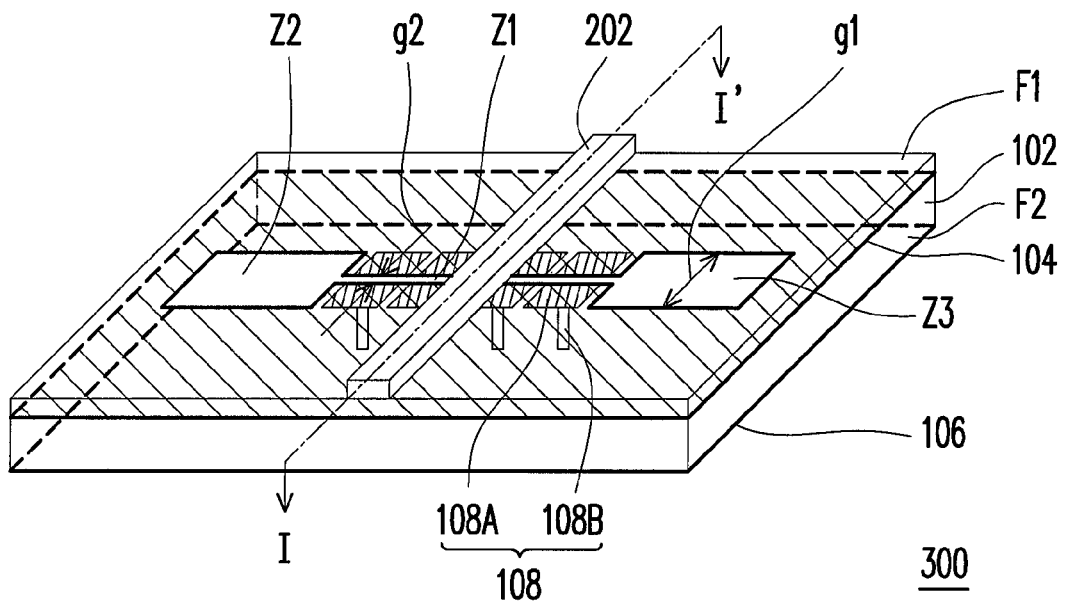
FIG. 3 is a side view of a bandstop filter according to another embodiment of the invention.

FIG. 3 is a side view of a bandstop filter according to another embodiment of the invention. Referring to FIG. 3, a difference between the bandstop filter 300 of the present embodiment and the bandstop filter 200 of FIG. 2A is that besides the line-shaped opening Z1, the defected metal layer 104 further includes a rectangular opening Z2 and a rectangular opening Z3, wherein the rectangular opening Z2 and the rectangular opening Z3 are respectively connected to two ends of the line-shaped opening Z1, and a length g1 of a contact side of the rectangular opening Z2 or the rectangular opening Z3 and the line-shaped opening Z1 is greater than a width g2 of the line-shaped opening Z1. Based on a dumbbell-shape opening formed by the line-shaped opening Z1, the rectangular opening Z2 and the rectangular opening Z3, the bandstop filter 300 having a stepped impedance resonator is formed. Similarly, the conductive mushroom-like structures 108 are also disposed between the defected metal layer 104 and the grounded metal layer 106, and are periodically arranged along the extending direction of the line-shaped opening Z1 in the dumbbell-shape opening. In this way, the reduction of the characteristic impedance of the line-shaped opening Z1 reduce the size of the bandstop filter 300.

Figure 4:
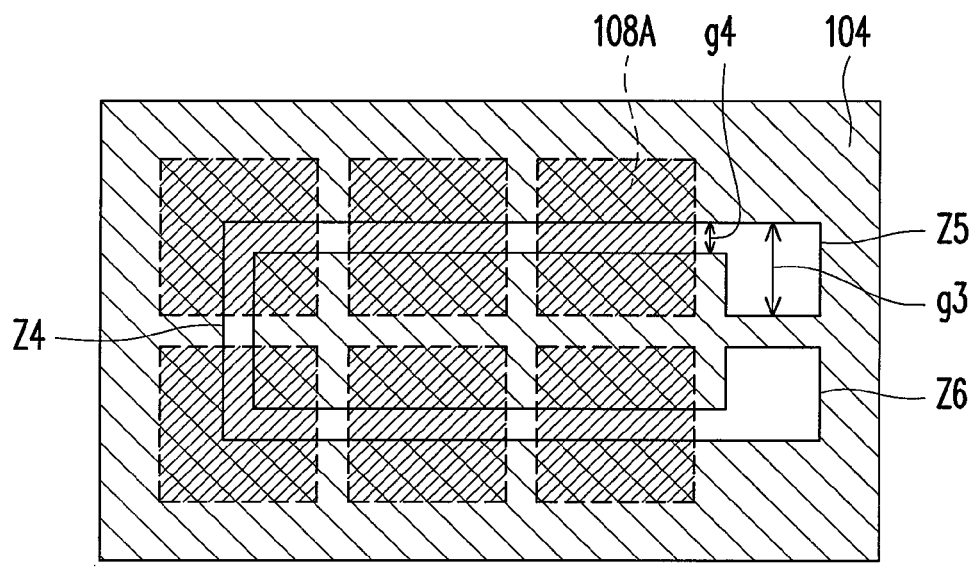
FIG. 4 is a top view of a resonator according to an embodiment of the invention.

It should be noticed that in other embodiments, the shape of the line-shaped opening Z1 is not limited to the line-shaped figure as that shown in FIG. 1A, FIG. 2A and FIG. 3. For example, FIG. 4 is a top view of a resonator according to an embodiment of the invention. Referring to FIG. 4, a difference between the resonator 400 of the embodiment and the defected ground structure 100 of FIG. 1A is that a shape of an opening on the defected metal layer 104 of the bandpass filter 400 is different from the shape of the line-shaped opening Z1 of the defected ground structure 100, and arrangement of the conductive mushroom-like structures 108 is also different as the shape of the opening on the defected metal layer 104 is different. As shown in FIG. 4, the defected metal layer 104 of the resonator 400 has a U-shape linear opening Z4, and two ends of the U-shape linear opening Z4 are respectively connected to a rectangular opening Z5 and a rectangular opening Z6, wherein a length g3 of a contact side of the rectangular opening Z5 or the rectangular opening Z6 and the U-shape linear opening Z4 is greater than a width g4 of the U-shape linear opening Z4. Moreover, the conductive mushroom-like structures 108 are periodically arranged along the U-shape linear opening Z4. In this way, the transmission line characteristic impedance can be reduced, so as to reduce a size of the bandpass filter 400.

In summary, the conductive mushroom-like structures are disposed between the defected metal layer and the grounded metal layer, and are periodically arranged along the line-shaped opening on the defected metal layer, so as to reduce a transmission line characteristic impedance and generate an extra capacitance load to form a slow wave effect, so that the size of the filter can be reduced. Moreover, the grounded metal layer below the conductive mushroom-like structures can isolate interferences between the filter and other lower-layer circuits, and meanwhile a radiation effect caused by the line-shaped opening on the defected metal layer can also be suppressed.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A defected ground structure with a shielding effect, comprising:
   a dielectric layer, having a first surface and a second surface opposite to the first surface;
   a defected metal layer, disposed in the dielectric layer and located between the first surface and the second surface, and having a line-shaped opening, wherein the defected metal layer does not connect the grounded metal layer;
   a grounded metal layer, disposed on the second surface; and
   at least one conductive mushroom-like structure, disposed between the defected metal layer and the grounded metal layer, arranged along an extending direction of the line-shaped opening periodically, and the conductive mushroom-like structure comprising:
   a laterally extending member, parallel to the defected metal layer, and a distance being maintained between the laterally extending member and the defected metal layer, wherein a projection area of the laterally extending member on the defected metal layer covers a portion of the line-shaped opening corresponding to the projection area of the laterally extending member; and
   a vertically extending member, connecting the laterally extending member and the grounded metal layer.

2. The defected ground structure with the shielding effect as claimed in claim 1, wherein the defected metal layer has another line-shaped opening, and the projection area of the laterally extending member on the defected metal layer covers a portion of the other line-shaped opening corresponding to the projection area of the laterally extending member.

3. The defected ground structure with the shielding effect as claimed in claim 1, wherein the vertically extending member comprises a conductive through via.

4. The defected ground structure with the shielding effect as claimed in claim 1, wherein the vertically extending member comprises a plurality of turning sections.

5. The defected ground structure with the shielding effect as claimed in claim 1, wherein the defected metal layer further comprises:
   a first rectangular opening; and
   a second rectangular opening, the first rectangular opening and the second rectangular opening being respectively connected to two ends of the line-shaped opening, and a length of a contact side of the first rectangular opening or the second rectangular opening and the line-shaped opening being greater than a width of the line-shaped opening.

6. The defected ground structure with the shielding effect as claimed in claim 1, wherein the conductive mushroom-like structure is arranged along the extending direction of the line-shaped opening periodically, and a predetermined space is maintained between two adjacent conductive mushroom-like structures.

7. The defected ground structure with the shielding effect as claimed in claim 1, wherein the distance between the laterally extending member and the defected metal layer is smaller than a distance between the laterally extending member and the grounded metal layer.

8. The defected ground structure with the shielding effect as claimed in claim 1, wherein the laterally extending member is a metal layer.

9. The defected ground structure with the shielding effect as claimed in claim 8, wherein a shape of the metal layer comprises a rectangle, an ellipse or an irregular geometric figure.

10. The defected ground structure with the shielding effect as claimed in claim 8, wherein the vertically extending member penetrates through the metal layer.

11. The defected ground structure with the shielding effect as claimed in claim 1, further comprising:
    a first microstrip line, disposed on the first surface.

12. The defected ground structure with the shielding effect as claimed in claim 11, further comprising:
    a second microstrip line, disposed on the first surface, and parallel to the first microstrip line.

* * * * *